United States Patent [19]
Lin et al.

[11] Patent Number: 6,165,886
[45] Date of Patent: Dec. 26, 2000

[54] ADVANCED IC BONDING PAD DESIGN FOR PREVENTING STRESS INDUCED PASSIVATION CRACKING AND PAD DELIMITATION THROUGH STRESS BUMPER PATTERN AND DIELECTRIC PIN-ON EFFECT

[75] Inventors: Chi-Fa Lin; Wei-Tsu Tseng; Min-Shinn Feng, all of Hsinchu, Taiwan

[73] Assignee: Winbond Electronics Corp., Hsinchu, Taiwan

[21] Appl. No.: 09/193,298

[22] Filed: Nov. 17, 1998

[51] Int. Cl.[7] ..................................... H01L 21/44
[52] U.S. Cl. .................... 438/612; 438/613; 438/615; 438/617; 438/666
[58] Field of Search .................... 438/106, 611, 438/612, 613, 614, 615, 617, 652, 666; 257/773, 774, 781, 784, 786

[56] References Cited

U.S. PATENT DOCUMENTS

| | | | |
|---|---|---|---|
| 5,700,735 | 12/1997 | Shiue et al. | 438/612 |
| 5,734,200 | 3/1998 | Hsue et al. | 257/755 |
| 5,736,791 | 4/1998 | Fujiki et al. | 257/781 |
| 5,773,899 | 6/1998 | Zambrano | 257/784 |
| 5,962,919 | 10/1999 | Liang et al. | 257/748 |
| 6,002,179 | 12/1999 | Chan et al. | 257/781 |

*Primary Examiner*—Olik Chaudhuri
*Assistant Examiner*—Alonzo Chambliss
*Attorney, Agent, or Firm*—W. Wayne Liauh

[57] ABSTRACT

An improved metal bonding pad is disclosed which can prevent the formation of cracks during the high temperature PECVD deposition, and the subsequent annealing, of a passivation layer which is formed to encroach the metal bonding pad and provide an encapsulation force on the metal bonding pad. The metal bonding pad comprises a plurality of stress bumpers on the periphery thereof. The stress bumpers can be hollow elongated round-cornered rectangles, pin-shaped circles, Y-shaped polygons, or ellipses. The stress bumpers, which create a discontinuous structure in the metal pad, can effectively stop stress propagation as well as relieve and re-direct stress propagation, so as to maintain the integrity of the passivation encroachment and prevent the peeling off problems often observed with the metal bonding pad.

9 Claims, 3 Drawing Sheets

ADVANCED IC BONDING PAD DESIGN FOR PREVENTING STRESS INDUCED PASSIVATION CRACKING AND PAD DELIMITATION THROUGH STRESS BUMPER PATTERN AND DIELECTRIC PIN-ON EFFECT

FIELD OF THE INVENTION

The present invention relates to an improved bonding pad structure for improving the production yield during the fabrication of semiconductor chips. More specifically, the present invention relates to an improved bonding pad design which can eliminate or at least minimize the bonding pad peeling off problems often encountered during the wire bonding step in the fabrication of semiconductor chips so as to improve the production yield. Unlike the prior art techniques, the present invention can be easily implemented without requiring a complicated multilayered structure. Thus, the present invention can achieve significant benefits without incurring substantially increased manufacturing cost.

BACKGROUND OF THE INVENTION

In the fabrication of semiconductor chips, bonding pads are commonly used to facilitate the wire bonding process which provides electric connections to electrical terminals on the associated devices. The conventional bonding pad design to deposit a square metal pad, about 100 $\mu$m by 100 $\mu$m, on the semiconductor surface. During the wire bonding process to attach the solder bumps, however, the bonding pad can often be lifted off due to the high pulling force or inadequate adhesion between the metal bonding pad and the semiconductor surface. As the density of semiconductor devices becomes increasingly higher resulting in increased stress per unit area, the bonding pad peeling off problems become more profound. This is further complicated by the fact that, in order to save fabrication cost and remain competitive, inexpensive metals such as aluminum have been prevalently used as the metal bonding pad and wiring material, replacing the much more expensive gold. Due to its higher thermal expansion coefficient, the use of aluminum wire and bonding pad causes substantially greater stress to be imposed, thus exacerbates the problem.

One commonly utilized approach to ameliorate the bonding pad peel-off problem is to form a passivation layer around the periphery of the bonding pad. The passivation layer causes the metal bonding pad to be partially encapsulated, at least at the periphery thereof. The encroachment area formed by the passivation layer helps the metal bonding pad to stay in place during the wire bonding process. However, due to the significant difference between the thermal expansion coefficients of the metal bonding pad and the passivation layer, which is typically a non-metal dielectric material such as silicon nitride or silicon oxide, the metal bonding pad can often crack during the deposition of the dielectric passivation layer or during the post passivation annealing process. Typically, the passivation layer is formed by PECVD (plasma enhanced chemical vapor deposition) process at a temperature of about 400° C. The metal bonding pad will be subject to a significant temperature raise both during and after the passivation layer deposition. The large difference in the thermal expansion coefficients between the passivation layer and the metal bonding pad will exert a high mechanical stress on the metal bonding pad. If the stress is high enough and if the thickness of the bonding pad is not thick enough, cracks will develop, resulting in substantially reduced adhesion between metal bonding pad and the semiconductor chip.

Several prior art references have taught various ways to solve the bonding pad peel-off problem. For example, U.S. Pat. No. 5,734,200, the content thereof is incorporated by reference, discloses a polycide bonding pad structure for use with an aluminum wire that resists stresses that would otherwise peel the pad from the substrate. The bonding pad structure contains a polysilicon layer adhered to an insulating layer, typically a field oxide layer formed of thermal silicon oxide, on a semiconductor substrate, an overlying refractory metal polycide layer, such as tungsten, titanium, platinum or palladium, a second polysilicon layer, a refractory metal layer, and a thick aluminum alloy bonding pad. The purpose of this relatively complex bonding pad structure is to ameliorate the use of Al wires (in place of the much more expensive gold wires), which impose greatly increased stress due to its greater coefficient of thermal expansion on the thermal bonding pads resulting in drastically reduced yield.

U.S. Pat. No. 5,736,791, the content thereof is incorporated by reference, discloses a semiconductor and an associated bonding pad structure of a multilayered wiring structure. The bonding pad structure comprises a first wiring layer and a second wiring layer which is located over the first wiring layer and an interlayer insulation layer between the wiring layers which has an electrically conductive component so as to electrically connect the wiring layers through a plurality of via holes. The first wiring layer has a wiring pattern including a plurality of spaced apart portions, each of which is connected to the second wiring layer through an appropriate via hole. The bond pad structure is such that no crack is formed in the interlayer insulation layer during wiring bonding.

U.S. Pat. No. 5,773,899, the content thereof is also incorporated by reference, discloses a bonding pad for a semiconductor structure which prevents damage during a bonding process. The semiconductor chip has conductive regions interconnected by a metal pattern, and a metal region is disposed over the metal pattern. The metal region forms the bonding pad over the conductive regions. Furthermore, the metal region is in direct contact with the metal pattern for substantially the whole bonding pad area. With the arrangement disclosed in the '899 patent, the metal region absorbs mechanical stress induced when a bonding wire is bonded to the metal region during the bonding process. The metal region should be sufficient thick so as not to be perforated during the bonding process and that the metal pattern is not damaged.

The above-mentioned prior art patents have their respective advantages and disadvantages. However, due to the immense pressure faced by semiconductor manufacturers to constantly cut the production cost, it is highly desirable to explore other methods and bonding pad designs that may provide a more cost-effective way to solve the bonding pad peeling off problems and improve the production yield. Most preferably, the improved bonding pad design should be able to be implemented easily and without incurring large additional costs.

SUMMARY OF THE INVENTION

The primary object of the present invention is to develop an improved bonding pad structure which can eliminate or at least minimize the bonding pad peeling off problems during the wiring bonding stage of the semiconductor fabrication process. More specifically, the primary object of the present invention is to provide a more rugged, but not overly complicated, bonding pad structure which will not be peeled off when a high thermal stress is exerted on the aluminum or other metal based bonding pad.

As it is discussed earlier, the common approach to improve the stability of the bonding pad is to provide a passivation layer around the periphery of the metal bonding pad to as to exert an encapsulation force to help holding the metal bonding pad in place, in addition to the adhesion force already provided on the metal bonding pad. However, due to the large difference in the thermal expansion coefficients between the aluminum metal and the dielectric passivation layer, the passivation layer, which is typically made of relatively brittle silicon glass, is often caused to crack during the deposition of the dielectric passivation layer or during the post-passivation annealing process.

In the present invention, a passivation layer is formed on the metal bonding pad, however, the metal bonding pad is structured to contain a plurality of stress bumpers in areas to be encroached by the passivation layer, or the passivation encroachment area. In one preferred embodiment of the present invention, the stress bumper is a hollow rectangle with round corners. The round corners of the stress bumper can minimize the stress concentration at sharp edges, and the hollow pattern can increase the junction line length between the passivation layer and the semiconductor layer below the metal bonding pad to consequently increase the adhesion and through the pin-on effect to increase the adhesion of the bonding pad.

In another preferred embodiment of the present invention, the stress bumper is a pin-hole shaped circle. Both embodiments have proven to be effective to terminate the stress propagation across the passivation layer, and thus effectively preventing the formation of cracks in the passivation layer, or arresting the propagation of cracks should they be formed.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved bonding pad structure which can eliminate or at least minimize the bonding pad peeling off problems during the wiring bonding stage of the semiconductor fabrication process by preventing cracks in the encroaching passivation layer. One main characteristic of the metal bonding pad structure of the present invention is that it provides a substantially more rugged bonding pad structure which will not cause the passivation encroachment to crack when a passivation layer is deposited under a high temperature PECVD condition on the metal based bonding pad. Another main characteristic is that the improved bonding pad structure of the present invention does not involve an overly complicated structure, thus it can be implemented in a very cost effective manner without incurring substantially increased production cost.

As it is discussed earlier, a common approach to improve the stability of the bonding pad is to provide a passivation layer around the periphery, or the encroachment area, of the metal bonding pad to as to exert an encapsulation force to help holding the metal bonding pad in place, in addition to the adhesion already provided between the metal bonding pad and the semiconductor surface layer. The passivation layer is typically formed by PECVD (plasma enhanced chemical vapor deposition) process at a temperature of about 400° C. or above. As a result, the metal bonding pad will be subject to a significant temperature raise both during and after the passivation layer deposition. The large difference in the thermal expansion coefficients between the passivation layer and the metal bonding pad will the metal bonding pad to be subject to a very high mechanical stress. During cooling, the shrinking metal pad, due to its high thermal expansion coefficient, pulls the passivation inwardly thus also creating a very high mechanical stress on the passivation layer. hen the stress is high enough and the thickness of the passivation layer is not thick enough, cracks will develop, resulting in breakdown in the encapsulation force provided by the passivation layer on the metal bonding pad.

Figure 1:
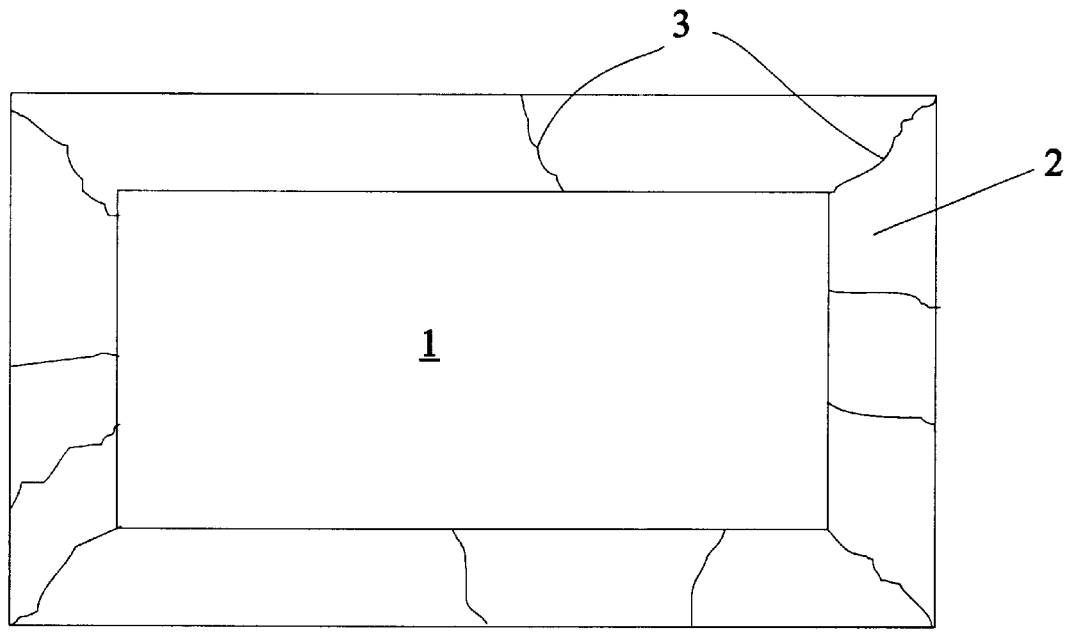
FIG. 1 is schematic drawing showing that cracks are formed in a passivation layer which is formed above and around the periphery of a metal bonding pad.

FIG. 1 is schematic drawing showing that cracks 3 were formed in the passivation layer 2 which was formed above and around the periphery of the aluminum bonding pad 1. SEM photos also confirmed the existence of the plurality of micro-cracks in the passivation layer. The passivation layer can be silicon nitride or silicon oxide, and the bonding pad is typically made of aluminum, which is substantially less expensive than other metals such as gold but has a substantially higher thermal expansion coefficient.

Figure 2:
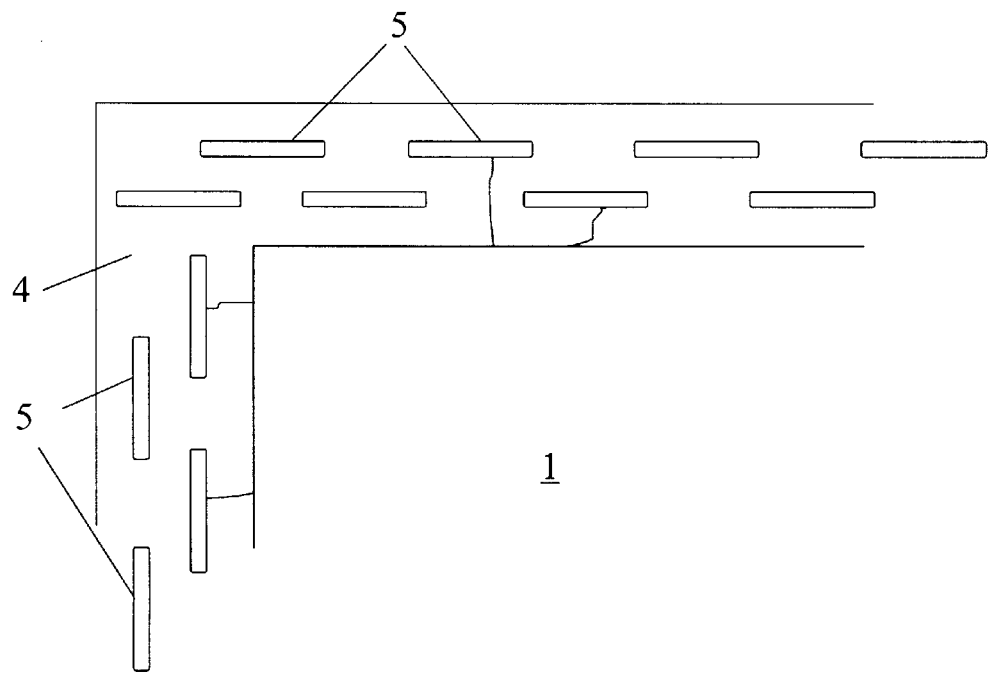
FIG. 2 is schematic drawing showing first preferred embodiment of the present invention in which the periphery of the metal bonding pad is structured to contain a plurality of rectangularly shaped stress bumpers.

In the present invention, the metal bonding pad is structured to contain a plurality of stress bumpers. FIG. 2 is schematic drawing showing first preferred embodiment of the present invention in which the periphery 4 of a metal bonding pad 1 is structured to contain a plurality of rectangularly shaped stress bumpers 5. In this first preferred embodiment of the present invention, each of the stress bumpers is a hollow rectangle with round corners. The round corners of the stress bumper can minimize the stress concentration at sharp edges, and the hollow pattern can increase the junction line length between the passivation layer and the semiconductor layer below the metal bonding pad to consequently increase the adhesion and through the pin-on effect to increase the adhesion of the bonding pad.

Figure 3:
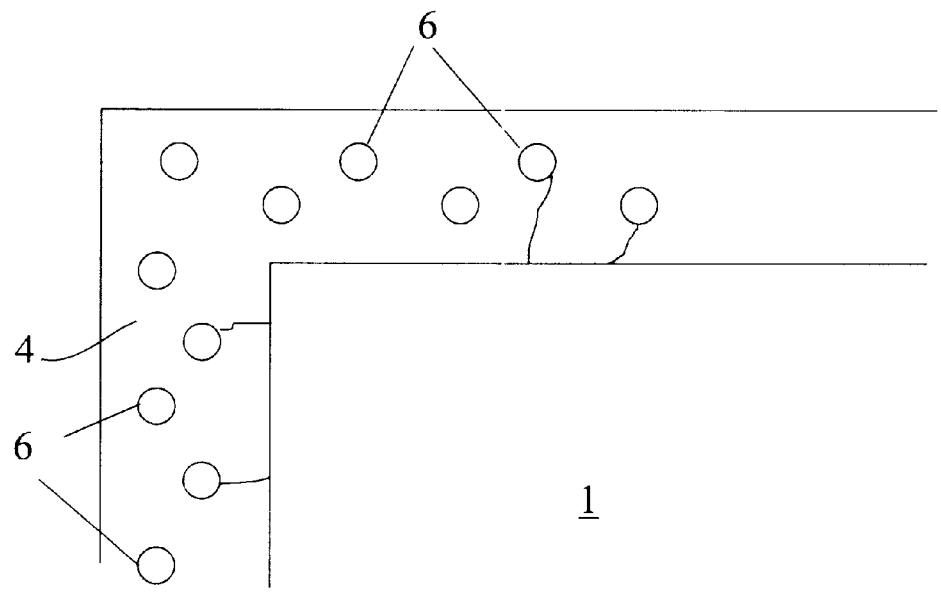
FIG. 3 is schematic drawing showing second preferred embodiment of the present invention in which the periphery of the metal bonding pad is structured to contain a plurality of pin-hole shaped stress bumpers.

FIG. 3 is schematic drawing showing second preferred embodiment of the present invention in which the periphery 4 of a metal bonding pad 1 is structured to contain a plurality of pin-hole shaped stress bumpers 6. In the second preferred embodiment of the present invention, the stress bumper is a pin-hole shaped circle. Both embodiments have proven to be effective to terminate the stress propagation across the passivation layer, and thus effectively preventing the formation of cracks in the passivation layer, as well as arresting the propagation of cracks when the cracks are formed.

Figure 4:
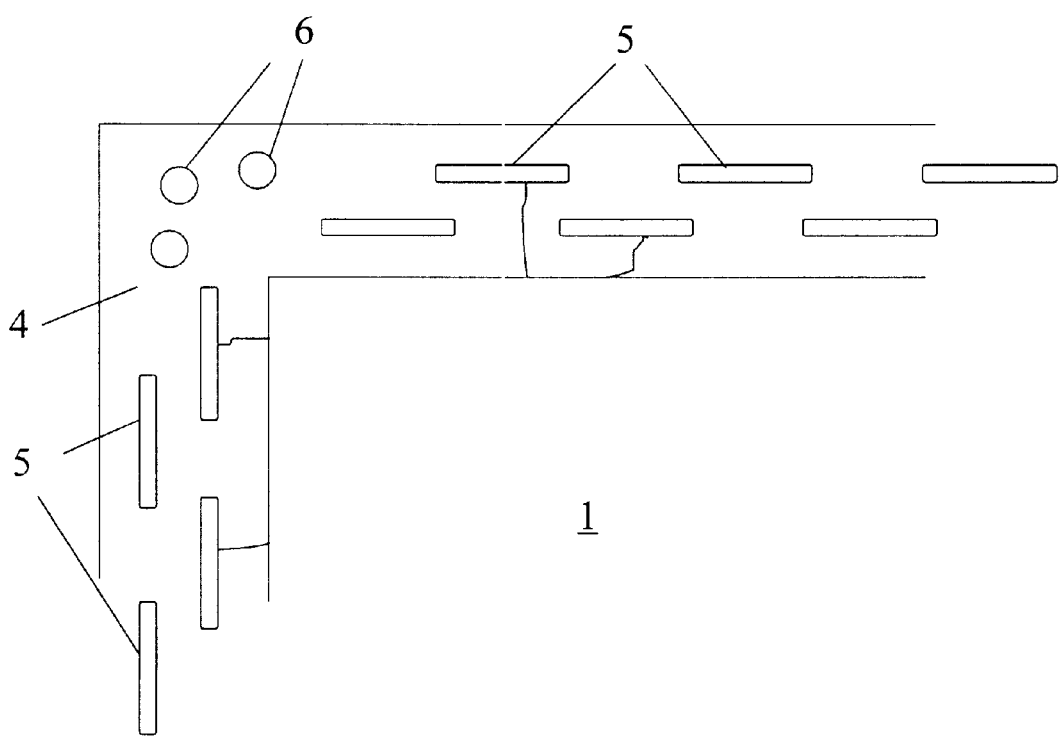
FIG. 4 is schematic drawing showing third preferred embodiment of the present invention in which the periphery of the metal bonding pad is structured to contain a plurality of pin-hole shaped stress bumpers around the corner thereof and a plurality of elongated stress bumpers along the edges.

The pin-hole shaped bumpers will be better suited for situations wherein there is no directional preference in the cracks. However, since most the cracks were observed to be growing in a direction perpendicular to the edges of the bonding pad, elongated rectangular stress bumpers may be preferred in most applications so as to be able to more effectively arrest the crack growth, since the elongated bumper provides a much greater linear coverage per unit bumper. Another design option is to use pin-hole shaped bumpers 6 around the corners of the bonding pad, and the rectangular bumpers 5 along the edges, as shown in FIG. 4.

Figure 5:
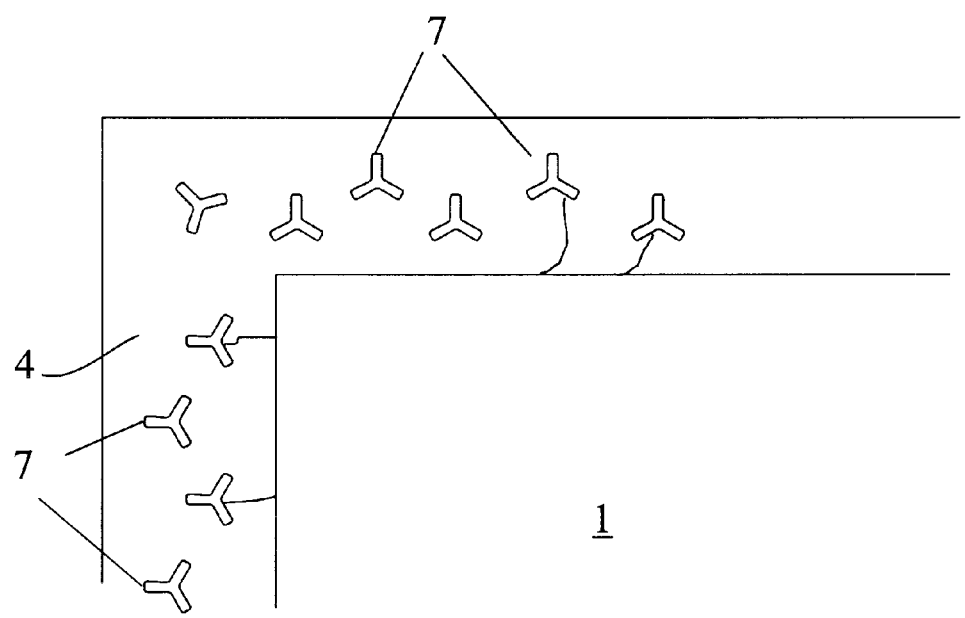
FIG. 5 is schematic drawing showing fourth preferred embodiment of the present invention in which the periphery of the metal bonding pad is structured to contain a plurality of Y-shaped stress bumpers.

Other design options, such an elongated elliptically shaped bumpers with their major axis parallel to the edges of the bonding pad, can also be easily provided. Furthermore, the stress bumpers can be radiating polygons such as Y-shaped stress bumpers. FIG. 5 is schematic drawing showing fourth preferred embodiment of the present invention in which the periphery of the metal bonding pad is structured to contain a plurality of Y-shaped stress bumpers. Again, another important advantage of the hollow stress bumpers of the present invention is that the passivation layer will grow through them to reach the dielectric layer underneath the metal bonding pad. This allows a plurality of anchors to be formed through the metal bonding pad and further improves the stability of the metal bonding pad to the semiconductor surface. In summary, the stress bumpers, which create a discontinuity in the encroached metal pad, can effectively stop the stress propagation as well relieve and re-direct stress propagation. The hollow holes of the stress bumper design also allows the passivation layer to grow therethrough and merge with the underlying dielectric layer. This can substantially improve the adhesion of the metal bonding pad to the semiconductor structure. Furthermore, the extra linear distance created along the periphery of the stress bumpers can also substantially increase the extent of passivation encroachment thus substantially increasing the encapsulation force.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for the fabrication of semiconductor chips comprising the steps of;
    (a) forming a plurality of semiconductor devices on a substrate;
    (b) forming a bonding pad on a surface of said semiconductor devices;
    (c) forming a passivation layer at least on the periphery of said bonding pad;
    (d) wherein said bonding pad contains a plurality of stress bumpers formed along the periphery of said bonding pad, which are hollow round-cornered rectangles, circles, radiating polygons, or ellipses formed through said bond pad to absorb a mechanical stress generated when said bonding pad and said passivation layer are subject to a large temperature change.

2. The method for the fabrication of semiconductor chips according to claim 1 wherein said bonding pad is an aluminum bonding pad.

3. The method for the fabrication of semiconductor chips according to claim 1 wherein said passivation layer comprises silicon oxide or silicon nitride.

4. The method for the fabrication of semiconductor chips according to claim 1 wherein said passivation layer is formed by plasma enhanced chemical vapor deposition at a temperature around or above 400° C.

5. The method for the fabrication of semiconductor chips according to claim 1 wherein said stress bumpers are hollow elongated rectangles each with its long side aligned along an edge of said bonding pad.

6. The method for the fabrication of semiconductor chips according to claim 1 wherein said stress bumpers are pin-hole shaped hollow bumpers.

7. The method for the fabrication of semiconductor chips according to claim 1 wherein said stress bumpers are hollow elongated ellipses each with its major axis aligned along an edge of said bonding pad.

8. The method for the fabrication of semiconductor chips according to claim 1 wherein said stress bumpers are hollow Y-shaped stress bumpers.

9. The method for the fabrication of semiconductor chips according to claim 1 wherein said stress bumpers comprise a plurality of hollow elongated rectangles along edges of said bonding pad and a plurality of pin-hole shaped hollow circles around its corners.

* * * * *